(12) United States Patent
Vermeer et al.

(10) Patent No.: US 8,151,448 B2
(45) Date of Patent: Apr. 10, 2012

(54) COMPONENT PLACEMENT APPARATUS, COMPONENT FEEDING APPARATUS AND METHOD

(75) Inventors: Adrianus Johannes Petrus Maria Vermeer, BW Geldrop (NL); J. T. A van De Ven, La Veldhoven (NL)

(73) Assignee: Assembleon N.V., La Veldhoven (NL)

( * ) Notice: Subject to any disclaimer, the term of this patent is extended or adjusted under 35 U.S.C. 154(b) by 1712 days.

(21) Appl. No.: 11/134,516

(22) Filed: May 23, 2005

(65) Prior Publication Data

US 2005/0276170 A1 Dec. 15, 2005

(30) Foreign Application Priority Data

Jun. 11, 2004 (EP) .................................. 04102657

(51) Int. Cl.
*B23P 19/00* (2006.01)

(52) U.S. Cl. ............... 29/739; 29/744; 29/757; 29/832; 228/49.5; 369/30.84; 156/349; 414/935

(58) Field of Classification Search .................... 29/739, 29/740–744, 757, 759, 760, 832, 833, 834; 228/49.5; 369/30.84; 156/349; 414/935–941
See application file for complete search history.

(56) References Cited

U.S. PATENT DOCUMENTS

| | | | |
|---|---|---|---|
| 2,829,371 A | | 4/1958 | Sittner et al. |
| 4,283,847 A | * | 8/1981 | May .................................. 29/832 |
| 4,520,557 A | | 6/1985 | Harigane et al. |
| 4,922,434 A | * | 5/1990 | Fule ................................ 700/259 |
| 5,040,291 A | * | 8/1991 | Janisiewicz et al. ............. 29/840 |
| 5,456,001 A | * | 10/1995 | Mori et al. ........................ 29/739 |
| 5,727,311 A | * | 3/1998 | Ida et al. ........................... 29/832 |
| 5,864,943 A | * | 2/1999 | Arakawa et al. ................. 29/740 |
| 5,870,820 A | * | 2/1999 | Arakawa et al. ................. 29/740 |
| 5,910,024 A | | 6/1999 | Goins |
| 6,199,272 B1 | * | 3/2001 | Seto et al. ........................ 29/740 |

(Continued)

FOREIGN PATENT DOCUMENTS

CN 1325612 A 12/2001

(Continued)

OTHER PUBLICATIONS

The Search Report (with translation) received in the related Taiwant Patent Application No. 094115286, dated Mar. 6, 2011.

*Primary Examiner* — A. Dexter Tugbang
*Assistant Examiner* — Jeffrey T Carley
(74) *Attorney, Agent, or Firm* — Foley & Lardner LLP

(57) ABSTRACT

A component placement apparatus includes: a tray storing device having slots for storing trays, a tray transporting device for transporting a tray from the tray storing device to a pickup area, a controller for controlling the transport of the trays into and out of the tray storing device, and at least one component pickup and placement device for picking-up a component in a tray located in the pickup area and placing the component on a substrate. The tray storing device includes first and second parts located proximal and distal the pickup area, respectively. The first part stores trays (i) from which at least one component may be removed and/or (ii) that are expected to be needed at the pickup area in the short term. The second part stores trays, which are empty, full, or are not expected to be needed in the pickup area in the short term.

7 Claims, 5 Drawing Sheets

U.S. PATENT DOCUMENTS

| | | |
|---|---|---|
| 6,203,582 B1 * | 3/2001 | Berner et al. ............... 29/25.01 |
| 6,266,873 B1 * | 7/2001 | Kitamura et al. ............. 29/832 |
| 6,370,765 B1 * | 4/2002 | Hiramoto et al. ............. 29/740 |
| 6,374,484 B1 * | 4/2002 | Yoshida et al. ............... 29/740 |
| 6,513,233 B1 | 2/2003 | Nakao et al. |
| 6,557,247 B1 | 5/2003 | Lowe |
| 6,585,837 B1 | 7/2003 | Keil et al. |

FOREIGN PATENT DOCUMENTS

| | | |
|---|---|---|
| CN | 100544573 C | 9/2009 |
| EP | 0 883 333 A2 | 9/1998 |
| EP | 1078735 A2 | 2/2001 |
| TW | 306491 | 5/1997 |
| TW | 466177 | 12/2001 |
| TW | 520623 | 2/2003 |

\* cited by examiner

COMPONENT PLACEMENT APPARATUS, COMPONENT FEEDING APPARATUS AND METHOD

CROSS-REFERENCE TO RELATED APPLICATIONS

This application claims priority to EP 04102657.6, which was filed on Jun. 11, 2004 and which is incorporated by reference herein in its entirety.

BACKGROUND

A conventional component placement apparatus, component feeding device, and method of transport are known from the European Patent Application No. EP A2 0 883 333 ("the '333 Application"). The component placement apparatus according to the '333 Application comprises a component feeding device in which a carriage, which includes several slots for trays that contain electronic components, is movable in upward and downward directions. The component feeding device comprises a tray transporting device by means of which a tray located in a slot is movable in a horizontal direction to a pickup area. By means of a component pickup and placement device, a component is picked-up from the tray in the pickup area and transported to a desired location on a substrate. After one or more components are picked-up from the tray, the tray is placed back in the same slot. Subsequently, the carriage is moved in a vertical direction to align another slot, which includes another tray, with the tray transporting device.

A disadvantage of this component placement apparatus is that the removal of empty trays (as well as the insertion of new trays) can only take place if the carriage is temporarily stopped. During this time, no other tray can be placed in the pickup area, other than the tray that is located in the slot aligned with the tray transporting device. Moreover, safety measures need to be taken to prevent a new tray from being inserted in the slot aligned with the tray transporting device, else the tray located in the pickup area cannot be returned to the carriage. A main disadvantage of this conventional component placement apparatus, however, is that the time necessary to move the carriage upwards and downwards can be relatively long if, e.g., successively the upper, the lower, and again the upper tray are needed. Because of these time consuming movements of the carriage, the output of the component placement apparatus is relatively low.

What is needed, therefore, is an apparatus and a methodology that address at least one if not more of the deficiencies that afflict conventional practice, as previously described.

SUMMARY

An object of the invention is to provide a component placement apparatus with a higher output. This object has been achieved by the component placement apparatus according to the invention. In this apparatus, the tray storing device includes, among other possible things: (a) a first part close to the pickup area in which (i) trays, from which at least one component may be removed, are stored and/or (ii) trays, that are expected to be needed at the pickup area in the short term, may be stored; (b) a second part, which is located further away from the pickup area and in which trays, which are empty, full, or are not expected to be needed in the pickup area in the short term, may be stored; and (c) a controller that includes means for determining whether a tray should be stored in the first part or the second part.

According to another embodiment of the present invention, the component placement apparatus may include, among other possible things: (a) a tray storing device with slots for storing trays that, e.g., contain electronic components; (b) a tray transporting device for transporting a tray from the tray storing device to a pickup area; (c) a controller for controlling the transport of the trays into and out of the tray storing device; and (d) at least one component pickup and placement device for picking-up a component from the tray located in the pickup area and placing the component on a substrate.

According to another embodiment of the present invention, a component feeding device may includes, among other possible things: (a) a tray storing device with slots for storing trays that contain, e.g., electronic components; (b) a tray transporting device for transporting a tray from the tray storing device to a pickup area; and (c) a controller for controlling the transport of trays into and out of the tray storing device.

By dividing the tray storing device into at least first and second parts, the trays that are needed on short notice may be located relatively close to each other. As a result, the time necessary to align a desired slot with respect to the tray transporting device may be relatively short. Such a component feeding device may be used by a component placement device in which the time necessary to present a tray at the pickup area will be relatively short, as trays that are expected to be needed at the pickup area in the short term will be located relatively close to the pickup area. Moreover, as a result of the tray storing device being divided in two parts, it is relatively easy to safeguard, i.e., no trays can be simultaneously inserted (or removed) by both the operator and the tray transporting device while (a) trays are transferred by the tray transporting device from (and to) the first part and (b) the second part is refilled.

According to an embodiment of the component placement apparatus according to the invention, the component placement apparatus may be provided with safety means that allow trays to be transported by the tray transporting device from the first part to the pickup area and vice versa, while trays in the second part may be simultaneously removed from the tray storing device and/or new trays may be inserted into the second part.

Due to the safety means, it is possible to refill the second part of the tray storing device while trays in the first part are transferred to and from the pickup area. Moreover, the safety means may be relatively simple because it only needs to prevent the alignment of the tray transport device with respect to all slots of the second part.

If desired, the second part itself may be divided in two parts: (a) one part with trays that contain components but that are not expected to be needed at the pickup area in the short term; and (b) another part comprising empty trays. This renders the removal of the empty trays relatively simple.

According to another embodiment of the component placement apparatus according to the invention, the tray transporting device may be prevented, by the safety means, from transporting trays from the second part, during removal (and/or insertion) of trays in the second part. As a result, the safety means may effectively prevent multiple trays from being simultaneously inserted into the same slot by both an operator and the tray transporting device.

According to a further embodiment of the component placement apparatus according to the invention, the component placement apparatus may include a further pickup and placement device by means of which a component placed on a buffer forming substrate can be transferred to another substrate. In this manner, the further pickup and placement device may be used to place components accurately from the buffer forming substrate on the other substrate, while one or more components is put on the buffer forming substrate. Due to this measure, the output of the accurate pickup and placement device may be relatively high.

According to yet another embodiment of the component placement apparatus according to the invention, the tray storing device may be stationary whereas the tray transporting device may be movable along the slots of the tray storing device. As the weight of the tray storing device will normally be much greater than the weight of the tray transporting device, it is easier to move the tray transporting device with respect to the tray storing device than vice versa. Furthermore, the first part of the tray storing device may have a fixed and relatively small distance to the pickup area. Also, the second part of the tray storing device may be stationary and, therefore, refill actions may occur during operation.

According to another embodiment of the present invention, the invention relates to a method for optimizing the operation of a component feeding device that includes, among other possible things: (a) a tray storing device with slots for storing trays that contain, e.g., electronic components; (b) a tray transporting device for transporting a tray from the tray storing device to a pickup area; and (c) a controller for controlling the transport of trays into and out of the tray storing device. According to this method, a plurality of trays, which may include components, are inserted into the slots of the tray storing device, wherein at least one slot is empty. Subsequently, a tray is moved under control of the controller, by means of the tray transport device, to the pickup area at which location a component may be removed from the tray. Subsequently, the controller determines whether the tray will again be needed at the pickup area in the short term. If the tray is expected to be needed at the pickup area in the short term, the tray is stored in a slot of a first part of the tray storing device proximal the pickup area. Else, the tray is stored in a slot of a second part of the tray storing device located distal the pickup area. By doing so, the trays, which are expected to be needed in the short term, may be located relatively close to each other due and, therefore, the time necessary to transfer a tray from the pickup area to its slot and/or to transfer another tray to the pickup area may be relatively short.

According to another embodiment of the method according to the invention, by means of the tray transporting device, a tray in the second part, which is expected to be needed at the pickup area in the short term, may be transferred to a slot in the first part. During the time that the tray transporting device is not used to present a tray in the pickup area (or that the tray is left at the pickup area), the tray transporting device may be used to rearrange the sequence of trays in such a manner that all trays that are expected to be needed at the pickup area in the short term are located relatively close to each other.

According to another embodiment of the method according to the invention, by means of the tray transporting device, a tray in the first part, which is not expected to be needed in the pickup area in the short term, may be transferred to a slot in the second part. In this manner, trays, which are not expected to be needed, may be transferred away from the first part to the second part in which they may be stored. Empty trays, which will not be needed in the pickup area, may are be also transferred to this second part. All empty trays may be positioned relatively close to each other so that an operator can remove all trays from successive slots and refill them with new trays. In this manner, the time necessary to refill the tray storing device may be relatively short. According to another further embodiment of the method according to the invention, empty trays in slots in the second part may be removed from the tray storing device while trays in the first part are transported to and from the pickup area.

These and other features, aspects, and advantages of the present invention will become more apparent from the following description, appended claims, and accompanying exemplary embodiments shown in the drawings.

DETAILED DESCRIPTION

Figure 1:
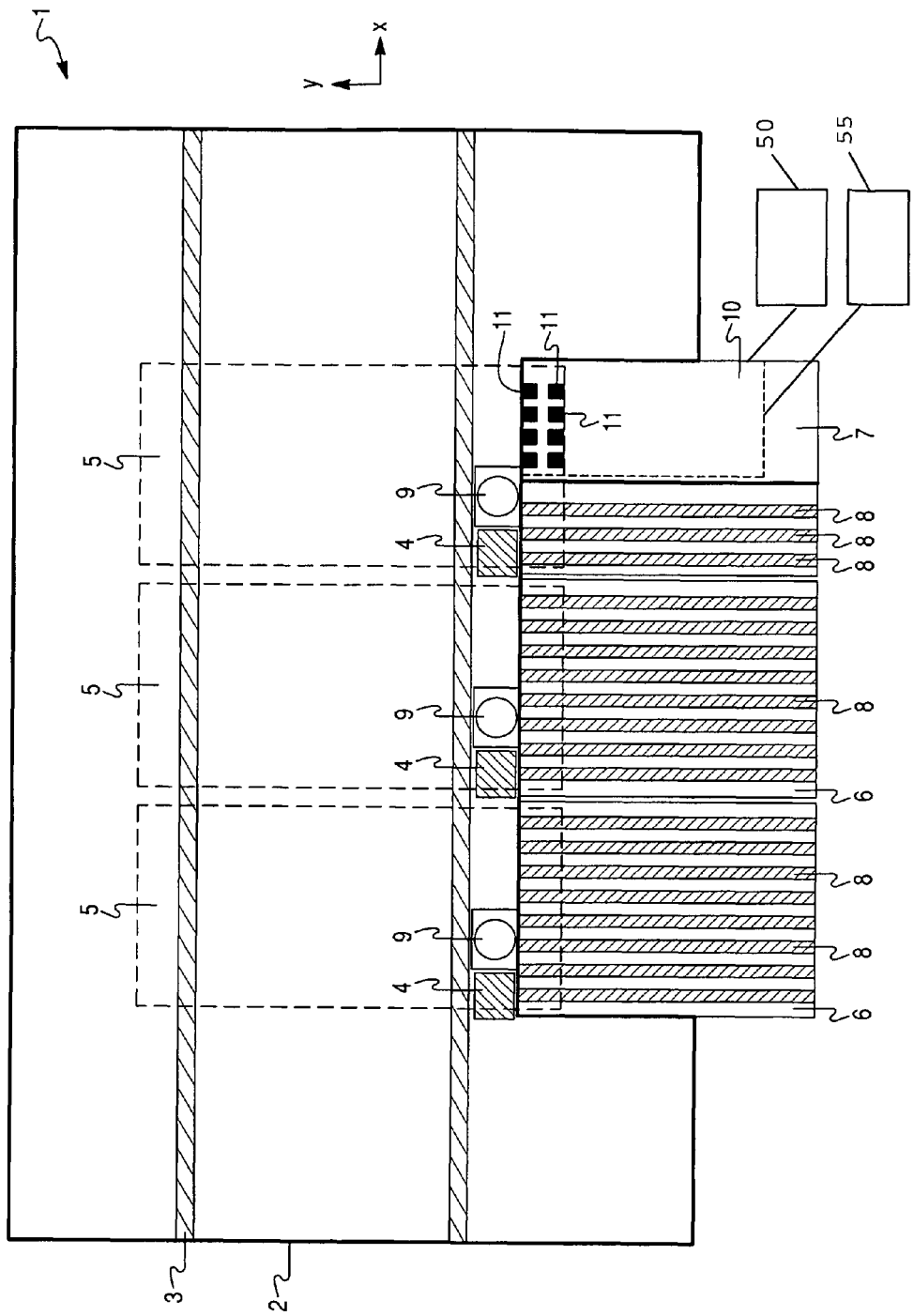
FIG. 1 is a top view of a component placement apparatus according to the present invention.

Presently preferred embodiments of the invention are illustrated in the drawings. An effort has been made to use the same, or like, reference numbers throughout the drawings to refer to the same or like parts.

FIG. 1 shows a top view of a component placement apparatus 1 according to the invention. The component placement apparatus 1 is provided with a frame 2 in which a transport device 3 for transporting substrates is accommodated. The transport device 3 can be indexed over a certain distance in the positive X-direction such that the transport device 3 can be moved back into its starting position in the negative X-direction after the certain distance has been covered. Substrates like printed circuit boards can be transported through the component placement apparatus 1 by the transport device 3.

The component placement apparatus 1 is furthermore provided with, e.g., three pickup and placement devices 4 that are provided with a pickup member, e.g., vacuum tube or other gripping device. The pickup and placement devices 4 are movable in, and opposite to, the X-direction as well as in, an opposite to, the Y-direction in an area 5, which is indicated by dotted lines. Near each pickup and placement device 4 is a trolley 6.

The trolley 6 is provided with a number of reels 8 (schematically shown) that are provided with tapes in which, e.g., electrical components may be stored. By means of the pickup and placement devices 4, components may be picked-up from one of the reels 8. Subsequently, the position of the component with respect to the pickup and placement device 4 may be detected by means of a component alignment device 9. Subsequently still, the component may be placed on a desired location on the substrate located in the area 5 of the respective pickup and placement device 4. Such a trolley 6 as well as reels 8 are conventionally known and, therefore, will not be further described.

A second trolley 7 also comprises reels 8 but furthermore comprises a component feeding apparatus 10. By means of the feeding apparatus 10, as will be explained with reference to the FIGS. 2-5, components 11, which are stored on trays 16 in the component feeding apparatus 10, may be presented in the area 5 of the pickup and placement device 4.

Figure 2:
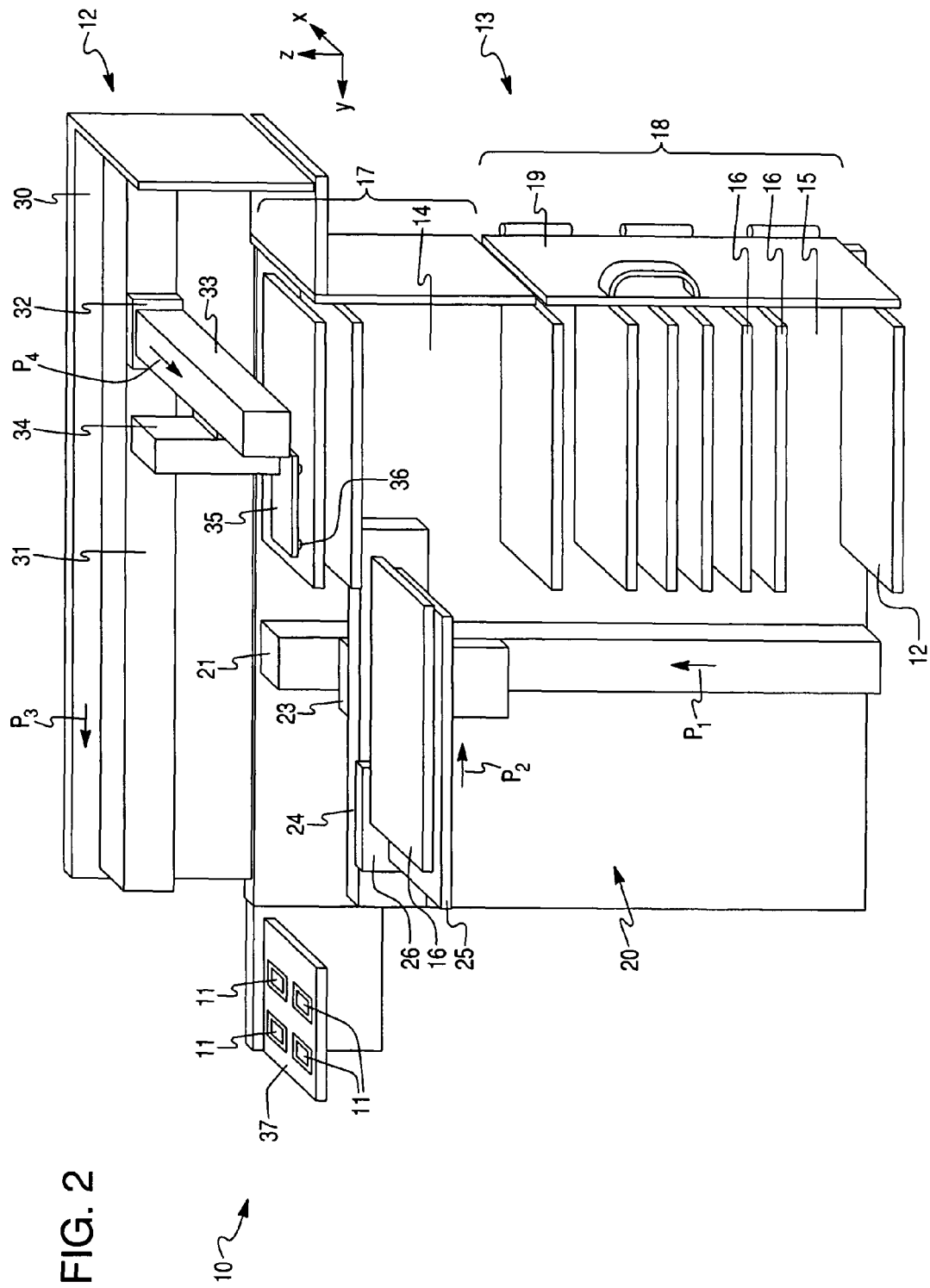
FIG. 2 is a perspective view of a component feeding device according to the present invention, which is used in the component placement apparatus shown in FIG. 1.
Figure 3:
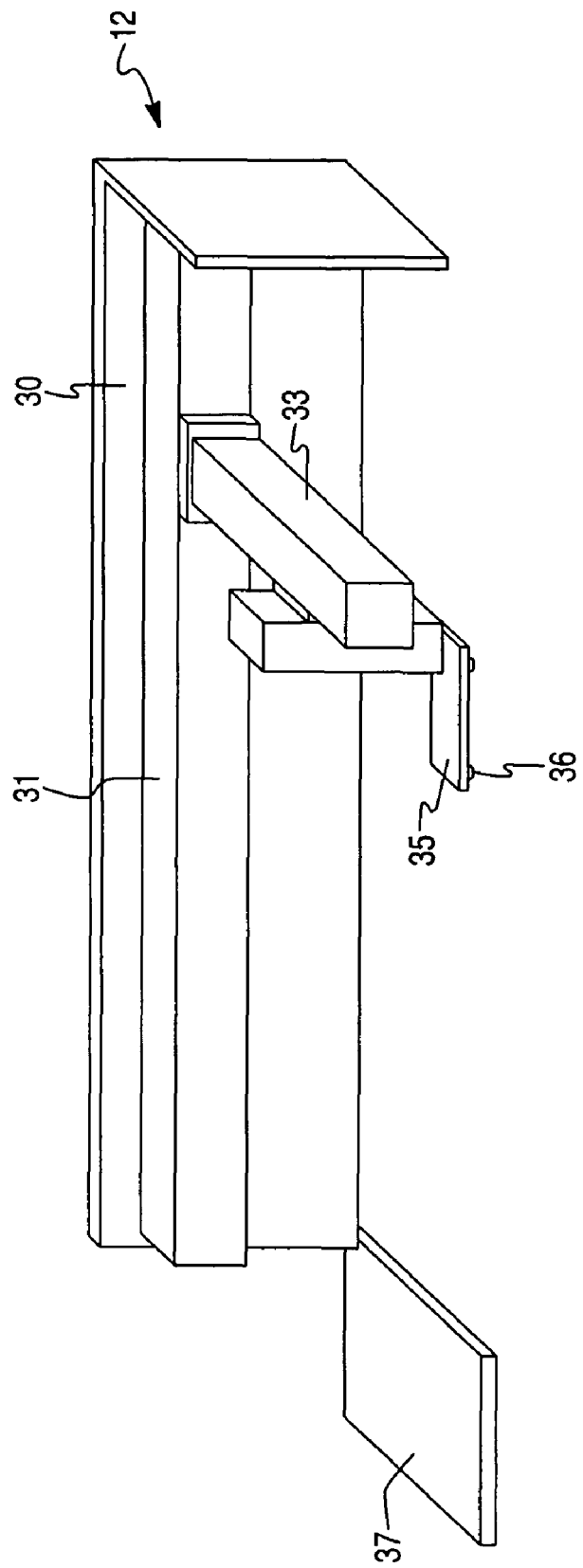
FIG. 3 is a perspective view of a top part of the component feeding device that is shown in FIG. 2.

FIG. 2 shows a perspective view of the component feeding device 10, which includes an upper part 12 and a lower part 13. The lower part 13 includes a tray storing device 14 having a number of slots 15 for storing stacked trays 16 that contain, e.g., electronic components. The slots 15 in an upper portion 17 of the tray storing device 14 are only accessible from the interior of the tray storing device 14 whereas the slots 15 in a lower portion 18 of the tray storing device 14 are accessible from both the interior and the exterior (by means of a door 19). The lower part 13 furthermore includes a tray transporting device 20. The tray transporting device 20 has a vertical column 21 along which a guide 23 is movable in, and opposite to, a direction indicated by arrow $P_1$, parallel to the Z-direction. Attached to the guide 23 is a horizontally extending beam 24 and a horizontally extending platform 25. To move a tray 16 into and out of a slot 15, a gripping device 26 is movable along the beam 24 in, and opposite to, a direction indicated by arrow $P_2$, parallel to the Y-direction.

The upper part 12 of the component feeding device 10 includes a frame 30 provided with a beam 31 that extends in the Y-direction. A guide 32 is movable along the beam 31 in, and opposite to, a direction indicated by arrow $P_3$, parallel to the Y-direction. Attached to the guide 32 is a beam 33 that extends parallel to the X-direction along which a guide 34 is movable in, and opposite to, a direction indicated by arrow $P_4$. Attached to the guide 34 is a plate 35 that carries a pickup and placement device 36, e.g., a vacuum nozzle or a gripper. The upper part 12 furthermore includes a buffer forming substrate 37 on which components 11 are presented to the pickup and placement device 4 of the component placement apparatus 1.

The operation of the component feeding device 10 according to the invention will now be explained. If no trays 16 are located in the slots 15, an operator will open door 19 and insert trays 16 in the slots 15 of the second part 18 of the tray storing device 14. Typically, each tray 16 will contain a different component. However, if one particular component is expected to be needed in a relatively large amount, it is possible to insert multiple trays 16 that contain the same component.

One or both of the component placement apparatus 1 and the component feeding device 10 includes a controller 50 in which information is loaded about which kind of component needs to be placed (by a specific pickup and placement device 4) at each position on a substrate. From this information, the controller 50 determines which components 11 need to be available on the buffer forming substrate 37 in the short term. Subsequently, the platform 25 is moved, by means of the guide 23, along the vertical column 21 in, or opposite to, the direction indicated by arrow $P_1$, until it is aligned with a slot 15 in which a tray 16 that contains the necessary component (s) is located.

By means of the gripping device 26, the tray 16 is removed from the slot 15 and moved onto the platform 25. The tray 16 is then moved upwardly on the platform 25 until the tray 16 is located in the same horizontal X, Y-plane as the substrate 37; when in the X, Y-plane of the substrate 37, the tray 16 is considered to be in the pickup area of the component feeding apparatus 10. When the tray 16 is in the pickup area, the pickup and placement device 36 is moved, by means of the guides 32, 34, in, and opposite to, the directions indicated by the arrows $P_3$, $P_4$, respectively, to pick-up a component 11 from the tray 16 and to place this component 11 on a desired location on the buffer forming substrate 37.

The controller 50 subsequently determines whether the tray 16 will be needed again in short term. If, in very short term, additional components 11 from the tray 16, which is present in the pickup area, will be needed, these components 11 may also be placed on the buffer forming substrate 37. Similarly, if the controller 50 determines that the tray 16 will be needed at the pickup area in the short term, the tray 16 may be transported, by means of the tray transporting device 20, to an empty slot 15 in the first part 17 of the tray storing device 14. If, however, the controller 50 determines that the tray 16 is empty or that the tray 16 will not be needed at the pickup area in the short term, the tray 16 may be transported, by means of the tray transporting device 20, to an empty slot 15 in the second part 18 of the tray storing device 14.

In this manner, the controller may direct the pickup and placement device 36 to place as many components 11 on the buffer forming substrate 37 as there are positions available. These components 11 will be picked-up by the pickup and placement device 4 and placed on a desired location on a substrate in the area 5.

If, in the interim, no trays 16 need to be presented at the pickup area, the controller may determine whether the trays 16 are in an optimized sequence such that, when eventually needed, the trays 16 may be presented as soon as possible to the pickup area. If the controller determines that there is a tray 16 in the first part 17, which is not expected to be needed in the short term at the pickup area, this tray 17 may be moved by means of the tray transporting device 20 in the manner previous described to a slot 15 in the second part 18 of the tray storing device 14. Similarly, a tray 16 in the second part 18, which the controller determines is expected to be needed at the pickup area in the short term, may be transferred to a slot 15 the first part 17 of the tray storing device 14.

It is also possible to optimize the sequence of the trays in both the first and second parts 17, 18 (by means of the controller). For example, it is possible to optimize the sequence of the trays 16 in the first part 17, thereby further reducing the time necessary to present a tray 16 at the pickup area. Similarly, it is possible to optimize the sequence of trays in the second part 18 so that, e.g., all empty trays 16 are located in the slots 15 that are most distal from the pickup area whereas the trays 16 with at least some components 11 are stored in the slots 15 in the second part 18 that are proximal to the first part 17. In this manner, all except one of the trays 16 that contain the same kind of components 11 will be located in the second part 18. The remaining tray will be located in the first part 17 closer to the pickup area; if this tray 16 is emptied, it will be moved to the second part 18 and a full replacement tray 16 with the same kind of components 11 will be moved to the first part 17.

If an operator wants to replace empty trays with full trays 16, the operator may open the door 19. The opening of the door 19 will be detected by means of a switch (not shown) and this information will be transferred to the controller. As long as the door 19 is open, the tray transporting device 20 will be controlled so that it can only store trays 16 in the first part 17 and/or removed trays 16 therefrom. Correspondingly, the operator can only remove and/or replace trays in the second part 18, thereby substantially reducing the risk of interference between the tray transporting device 20 and the operator.

Figure 4:
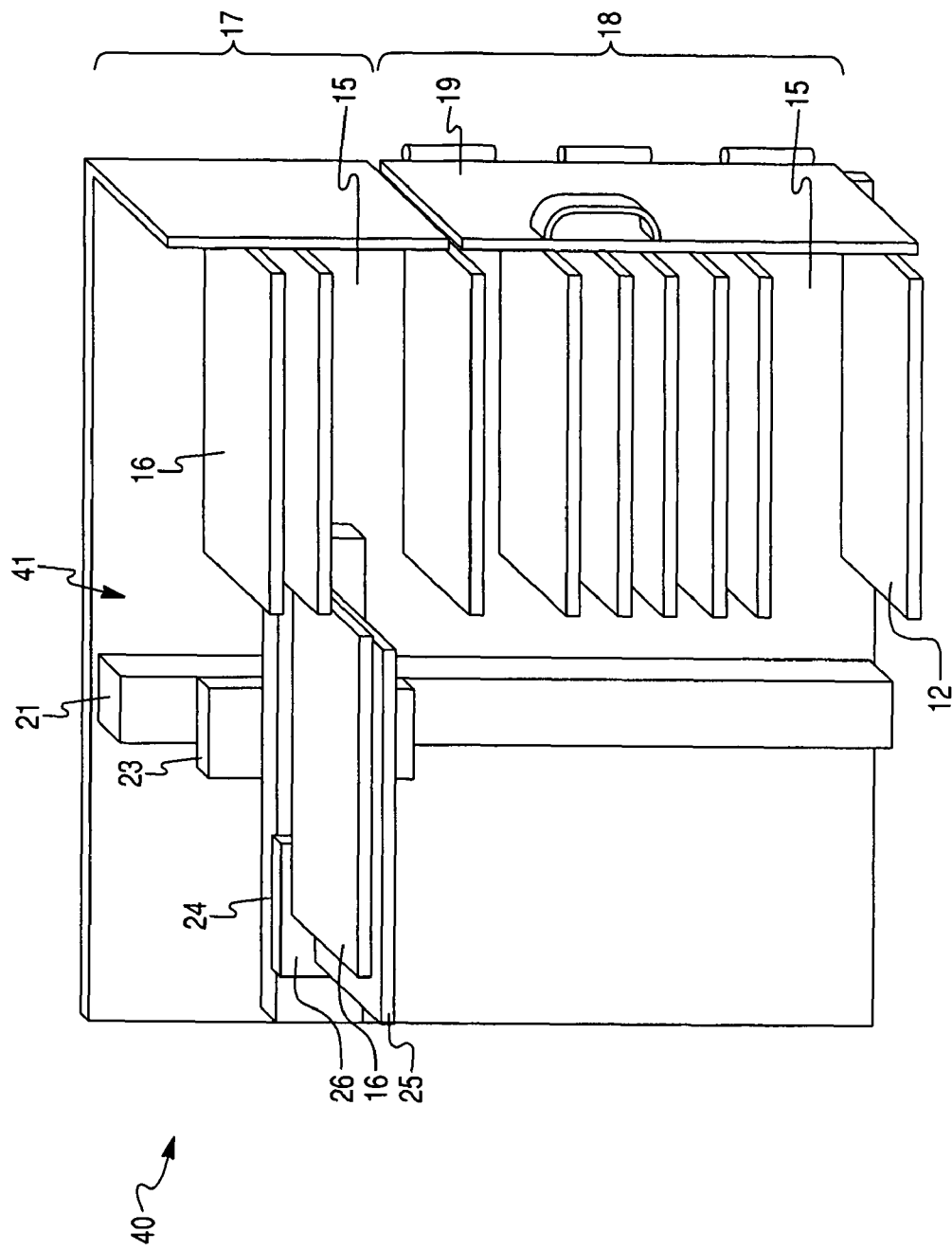
FIG. 4 is a perspective view of a bottom part of the component feeding device that is shown in FIG. 2.
Figure 5:
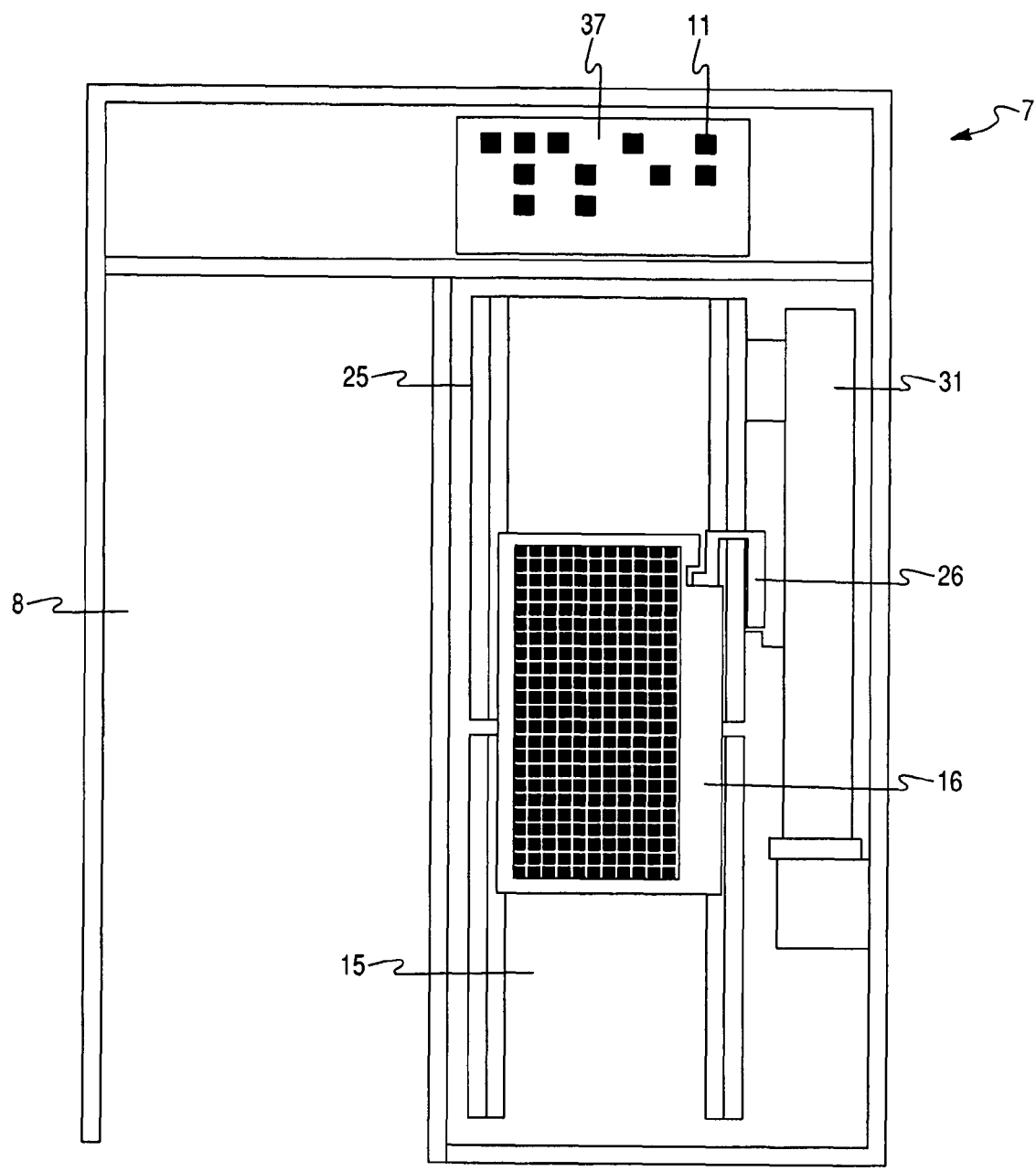
FIG. 5 is a top view of the component feeding device, which is shown in FIG. 2, being incorporated in a trolley for feeding components in trays as well as components in tapes.

By the device as shown in FIG. 2, components 11 may be moved, by means of the pickup and placement device 36, to the buffer forming substrate 37 and subsequently be moved, by means of the pickup and placement device 4, to a desired position on a substrate. However, as shown in FIG. 4, it is also possible to use a simpler component feeding device 40, whereby a tray 16 may be presented in a pickup area 41 that is directly accessible by means of the pickup and placement device 4. Such a component feeding device 40 may be less expensive than the previously described component feeding device 10, which includes the additional pickup and placement device 36. This component feeding device 40 may be suitable, e.g., if a component 11 from a tray 16 is only occasionally needed. Otherwise, it may be preferable to use the previously described component feeding device 10, whereby a buffer of components 11 on a buffer forming substrate 37 can be formed and, therefore, the time necessary for the pickup and placement device 4 to pick-up a component 11 coming from a tray 16 will be shorter.

Although the tray transporting device may be moved along the slots 15, it is also possible for the tray storing device 14 to be moved up and down such that: (a) the trays that are needed in the short term may be located in the middle part of the tray storing device 14; (b) the trays that are emptied may be stored in the lower part of the tray storing device 14; and (c) the trays that are provided with components that are not expected to be needed in the short term may be located in the upper part of the tray storing device 14.

It is also possible to provide the tray storing device 14 with a third part, located on the left side of the vertical column 21 (FIG. 4) and below the transport device 3. Such a third part may be, e.g., filled with trays 16 in a manner similar to the first part 17. Moreover, trays 16, which are not expected to be needed in the short term, may be stored in such a third part.

It is also possible to use the tray storing device 14 to store stacks of trays 16, whereby a single tray 16 may be removed from the stack loaded in the upper part 17 whereas the remaining trays 16 of the stack may be stored in the lower part 18. Moreover, it is also possible to use the tray storing device 14 to store wafers carrying components.

In each of the aforementioned embodiments, the controller may include a collision prevention means configured to prevent a collision between the pickup and placement devices 4, 36. In addition, the component placement apparatus 1 may be provided with a safety device or means 55 that allow trays 16 to be transported by the tray transporting device 20 from the first part 17 to the pickup area and vice versa, while trays in the second part 18 may be simultaneously removed from the tray storing device 14 and/or new trays 16 may be inserted into the second part 18. Due to the safety means 55, it is possible to refill the second part 18 of the tray storing device 14 while trays 16 in the first part 17 are transferred to and from the pickup area. Moreover, the safety means 55 may be relatively simple because it only needs to prevent the alignment of the tray transport device 20 with respect to all slots of the second part 18. According to another aspect, the tray transporting device 20 may be prevented, by the safety means 55, from transporting trays 16 from the second part 18, during removal (and/or insertion) of trays 16 in the second part 18. As a result, the safety means 55 may effectively prevent multiple trays 16 from being simultaneously inserted into the same slot by both an operator and the tray transporting device 20.

Although the aforementioned describes embodiments of the invention, the invention is not so restricted. It will be apparent to those skilled in the art that various modifications and variations can be made to the disclosed embodiments of the present invention without departing from the scope or spirit of the invention. Accordingly, these other apparatuses and methods are fully within the scope of the claimed invention. Therefore, it should be understood that the apparatuses and methods described herein are illustrative only and are not limiting upon the scope of the invention, which is indicated by the following claims.

What is claimed is:

1. A component placement apparatus for transporting trays between a tray storing device and a pickup area comprising:

a tray storing device having slots that are configured to store trays that are configured to contain components, the tray storing device comprising:
 a first part positioned proximal the pickup area and including a first set of the slots, wherein the first set of slots in the first part is configured to store trays (i) from which at least one component may be removed and/or (ii) that are expected to be needed at the pickup area in a short term; and
 a second part positioned distal the pickup area and including a second set of the slots, wherein the second set of the slots in the second part is configured to store trays, which are empty, full, or are not expected to be needed in the pickup area in the short term;
a tray transporting device that is configured to transport a tray from the tray storing device to the pickup area;
a controller that is programmed to control and controls the transport of the trays into and out of the tray storing device, wherein the controller is programmed to determine and determines whether a tray should be stored in either (a) the first set of the slots for storing trays (i) from which at least one component may be removed and/or (ii) that are expected to be needed at the pickup area in a short term, and not the second set of the slots or (b) the second set of the slots for storing trays, which are empty, full, or are not expected to be needed in the pickup area in the short term, and not the first set of the slots; and
at least one component pickup and placement device that is configured to pickup a component from a tray located in the pickup area and to place the component on a substrate.

2. The component placement apparatus according to claim 1, further comprising:
 a safety device configured to allow trays to be transported, by the tray transporting device, from the first part to the pickup area and vice versa while (a) trays in the second part are removed from the tray storing device and/or (b) new trays are inserted into the second part.

3. The component placement apparatus according to claim 2, wherein, by the safety device, the tray transporting device is configured to prevent at least one of transportation of trays from the second part, during insertion of trays in the second part and transportation of trays into the second part, during removal of trays from the second part.

4. The component placement apparatus according claim 1, further comprising:
 a second pickup and placement device that is configured to transfer a component, which is positioned on a first substrate, to a second substrate.

5. The component placement apparatus according to claim 4, wherein the component placement apparatus is configured to position multiple components on the first substrate substantially simultaneously.

6. The component placement apparatus according to claim 1, wherein the tray storing device is configured to remain stationary while the tray transporting device moves along the slots of the tray storing device.

7. The component placement apparatus according to claim 1, further comprising a door that is configured to allow access to the tray storing device, wherein the controller prevents the tray transporting device from accessing the second part when the controller receives information that the door is open.

* * * * *